(12) United States Patent
Smetana

(10) Patent No.: US 6,472,908 B1
(45) Date of Patent: Oct. 29, 2002

(54) DIFFERENTIAL OUTPUT DRIVER CIRCUIT AND METHOD FOR SAME

(75) Inventor: Kenneth Smetana, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/497,253

(22) Filed: Feb. 3, 2000

(51) Int. Cl.[7] .............................................. H03F 3/45
(52) U.S. Cl. .......................................... 327/52; 327/65
(58) Field of Search .............................. 327/52, 53, 54, 327/55, 65, 66, 89, 563; 330/252, 253, 254; 326/127; 333/215

(56) References Cited

U.S. PATENT DOCUMENTS

| | | | | |
|---|---|---|---|---|
| 4,638,260 A | * | 1/1987 | Hamley | 330/254 |
| 4,734,593 A | | 3/1988 | Teymouri et al. | 307/297 |
| 4,806,792 A | | 2/1989 | Simmons | 307/357 |
| 4,943,741 A | | 7/1990 | Estrada et al. | 307/455 |
| 5,107,145 A | | 4/1992 | Kurashima | 307/455 |
| 5,349,253 A | * | 9/1994 | Ngo et al. | 327/77 |
| 5,477,191 A | * | 12/1995 | Demicheli | 330/254 |
| 5,596,289 A | * | 1/1997 | Liu | 327/67 |
| 5,635,884 A | * | 6/1997 | Fujii | 333/215 |

* cited by examiner

Primary Examiner—Tuan T. Lam
Assistant Examiner—Hiep Nguyen
(74) Attorney, Agent, or Firm—Gray Cary Ware & Freidenrich

(57) ABSTRACT

An output circuit is provided which exhibits a waveform having a higher edge rate, with less ringing and power consumption than many conventional differential amplifier output driver circuits. A pre-driver stage using a current-mode logic (CML) design eliminates the frequency dependent transfer characteristics associated with emitter follower amplifiers used with emitter-coupled logic (ECL)-pre-drivers. The final stage CML circuit has been modified to eliminate the Miller-effect capacitance, using cascode transistors to maintain a constant voltage at the collectors of the final stage CML circuit transistors. The cascode transistors isolate the switching noise of the final stage CML transistor pair. Further, the bases of the final stage CML transistors present a smaller load to the pre-driver stage output, permitting the pre-driver stage to be a CML rather than an ECL design. A method of amplifying a differential signal in accordance with the principles of the above-described circuit is also provided.

14 Claims, 6 Drawing Sheets

US 6,472,908 B1

DIFFERENTIAL OUTPUT DRIVER CIRCUIT AND METHOD FOR SAME

BACKGROUND OF THE INVENTION

The invention relates generally to low impedance output stage driver circuits and, more particularly, to a modification of a current-mode logic (CML) circuit which permits high fidelity amplification of high speed signals into low impedance loads using an output stage differential CML amplifier.

It is well known to use a so-called differential amplifier to amplify a differential signal, such as a signal that may be used in a high speed transfer of digital data. When bipolar junction n-p-n transistors are used, such an amplifier is made by tying the emitters of two transistors together. The differential input signals are applied to the bases of the two transistors, and amplified differential output signals are provided at the transistor collectors. This type of differential amplifier is called CML circuit.

CML circuits are often used to amplify differential digital signals, where the first digital signal is the complement of the second digital signal. A constant current source is connected to coupled emitters, and relatively small changes to the emitter-coupled transistor base currents cause the constant current to flow from one of the emitter-coupled transistors, to the other. That is, the output voltages rapidly change from high to low, or visa versa. A digital type on/off signal that is input into such a circuit will be amplified, with a change in the dc level.

The dc level change in the amplified signal is typically not desired, and these dc levels can be shifted using emitter follower amplifiers. Besides providing a dc level shift, this configuration of the differential amplifier, called an emitter-coupled logic (ECL) circuit, also provide a greater drive capacity to subsequently connected loads. However, the greater drive comes at the expense of frequency dependent amplifier impedances which causes infidelities in signal amplification, such as overshoot and ringing. To some extent the frequency dependent transfer characteristics of the transistor can be mitigated by operating the emitter followers at higher current levels. However, in integrated circuit (IC) design power consumption is critical.

FIG. 1 is a schematic diagram of an output CML circuit using ECL and CML circuits (prior art). The output circuit 10 comprises a pre-driver stage 12 and a final stage 14. The pre-driver stage 12 is an ECL circuit as described above, where Q3 and Q4 are emitter-coupled transistors, and Q1 and Q6 are emitter followers used to interface the pre-driver stage 12 with the final stage 14. Q5 and R4 act as a constant current source, while Q2/R1 and Q7/R5 are used to bias the emitter followers Q1 and Q6. The differential inputs A and A1 are connected, respectively, to the bases of Q3 and Q4 on lines 16 and 18. The pre-driver outputs N2 and N1 are on lines 20 and 22.

The final stage 14 is a CML circuit as described above. Q8 and Q9 are emitter-coupled transistors, while Q1/R8 acts as a constant current source. The inputs N2 and N1 are connected on lines 20 and 22, respectively with the bases of Q9 and Q8. The final stage outputs Y and Yn are connected on lines 24 and 26, respectively to Q9 and Q8. When the circuit of FIG. 1 is an output driver circuit to drive large loads, the resistances of R6 and R7 are low, for example, 50 ohms.

FIG. 2 is an exemplary signal diagram illustrating signal degradation in the amplification process (prior art). Signal A on line 16 is shown as an ideal digital signal with near-perfect rise and fall times, and no overshoot or excessive damping characteristics. Signal N1 is the amplified signal on line 22 that is normalized with respect to gain. Alternately, signal N2 could be displayed having a polarity opposite to the A signal. Amplification has introduced imperfect transitions. These imperfections are compounded in the next stage of amplification as shown in signal Y, which has also been normalized with respect to gain. Overshoot can be mitigated by biasing emitter follower transistors Q1 and Q6 to operate at a higher quiescent current level.

Slow rise and fall times seen at the transitions of signals N1 and Y of FIG. 2 are largely due to the so-called Miller-effect capacitance. The Miller-effect capacitance acts to vary to input capacitance from the base of a transistor to the collector in response to the voltage presented to the base, making the transistor input impedance vary with respect to the frequency of the input signal. As the voltage on the base increases, for example on Q8, the signal is amplified and the voltage on the collector simultaneously decreases. The Miller-effect capacitance causes an increased parasitic current flow from base to collector, in a sense acting as a larger capacitor, and taking away current that would otherwise flow into the base of Q8.

The overshoot and ringing seen at the transitions of signal Y of FIG. 2 are largely due to the use of emitter follower amplifiers Q1 and Q6 (FIG. 1). As mentioned above, the emitter follows are used to shift the dc level of the output signal and to increase high frequency gain between stages. However, the improved high frequency response comes at the price of frequency dependent gain that promotes ringing.

It is known to use feedback capacitors between the base and collector of a transistor to improve the flatten the frequency response of an amplifier. To some extent this feedback minimizes the signal degradation problems associated with the circuit of FIG. 1. Cross-coupled feedback capacitors have been used in differential amplifiers. For example, a capacitor from the base Q8 to the collector of Q9, and a capacitor from the base of Q9 to the collector of Q8. However, these solution typically come at the expense of diminished frequency response. It is also known to form a cascode transistor combination to form an amplifier with improved frequency response and less sensitivity to Miller-effect capacitance. Many high-speed communication processes require circuitry that generates clean waveforms, promoting quicker recognition to changes in state and more resistance to error in the transfer of data. Improvements in the waveforms produced by differential amplifier driver output circuitry are required to support the above-mentioned circuits.

It would be advantageous if the Miller-effect capacitance associated with the bases of emitter-coupled transistors in an output circuit CML differential amplifier could be eliminated.

It would be advantageous if CML stages could be coupled without the necessity of emitter follower amplifiers to provide cleaner output signal transitions with less overshoot and ringing.

It would be advantageous if signal integrity in the amplification of signals by a differential amplifier could be improved without increasing the operating currents of the drive circuitry.

SUMMARY OF THE INVENTION

Accordingly, an output driver circuit is provided comprising a final stage differential amplifier including emitter-coupled first and second transistors, and a pre-driver stage differential amplifier including emitter-coupled first and second transistors. A cascode is connected to the final stage differential amplifier to maintain a constant voltage at the collectors of the first and second transistors of the final stage differential amplifier.

The cascode is a pair of transistors cascoded with the differential amplifier. A first cascode transistor has a collector connected to Vcc through a first load resistor and an emitter connected to the collector of the final stage first transistor. A second cascode transistor has a collector connected to Vcc through a second load resistor and an emitter connected to the collector of the final stage second transistor.

The cascode also includes a first current bleeder transistor having a collector connected to the collector of the final stage first transistor and an emitter operatively connected to ground, and second current bleeder transistor having a collector connected to the collector of the final stage second transistor and an emitter operatively connected to ground.

A method is also provided for amplifying differential signals, the method comprising:

receiving a pair of differential input signals at a corresponding pair of circuit inputs;

differentially amplifying the voltage of the differential input signals;

simultaneously with the amplification of the differential input signals, eliminating any changes in the capacitance of the circuit inputs responsive to the amplification of the differential input signals; and providing a pair of differential output signals which are amplified replicas of the corresponding differential input signals.

As in the above description of the circuit, the elimination of capacitance changes at the circuit inputs due to signal-amplification includes eliminating the Miller-effect capacitance at the bases of the final stage emitter-coupled transistors. The elimination of capacitance changes is accomplished in two sub-steps, comprising:

maintaining. a constant voltage at the collectors of the final stage emitter-coupled transistors; and.

bleeding current from the collectors of the final stage emitter-coupled transistors.

DETAILED DESCRIPTION OF THE PREFERRED EMBODIMENT

Figure 1:
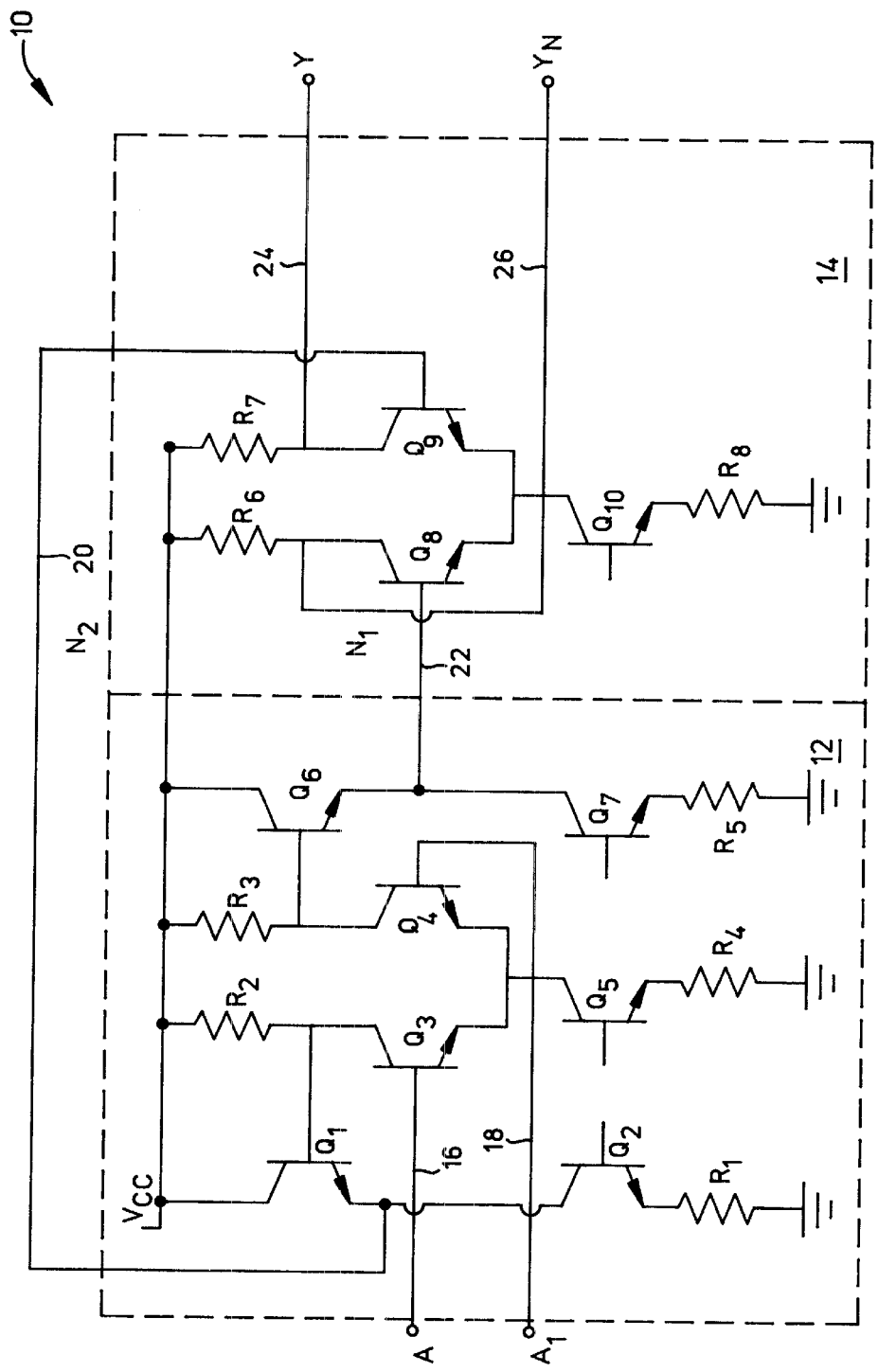
FIG. 1 is. a schematic diagram of an output CML circuit using ECL and CML circuits (prior art).
Figure 2:
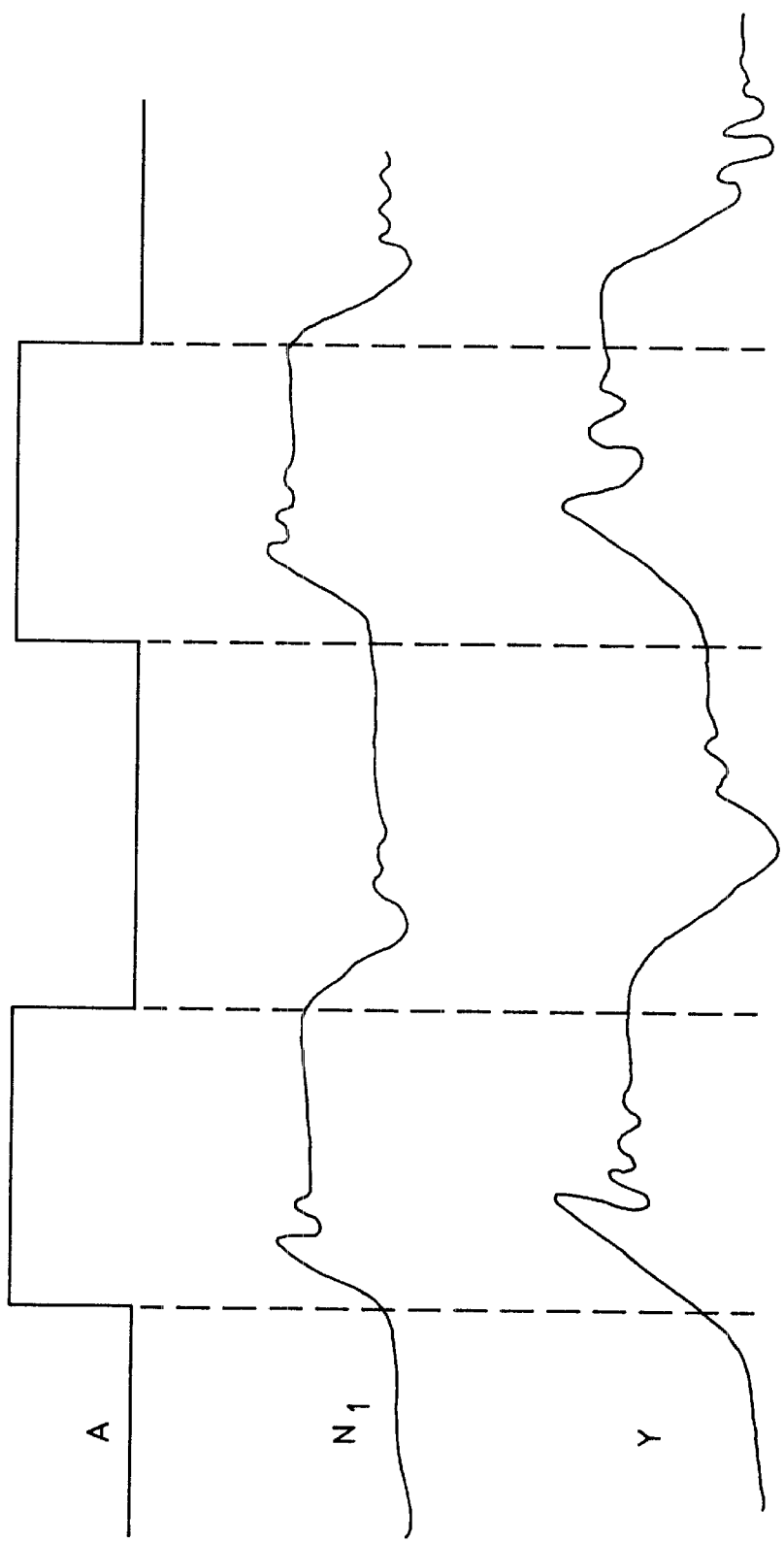
FIG. 2 is an exemplary signal diagram illustrating signal degradation in the amplification process (prior art).
Figure 3:
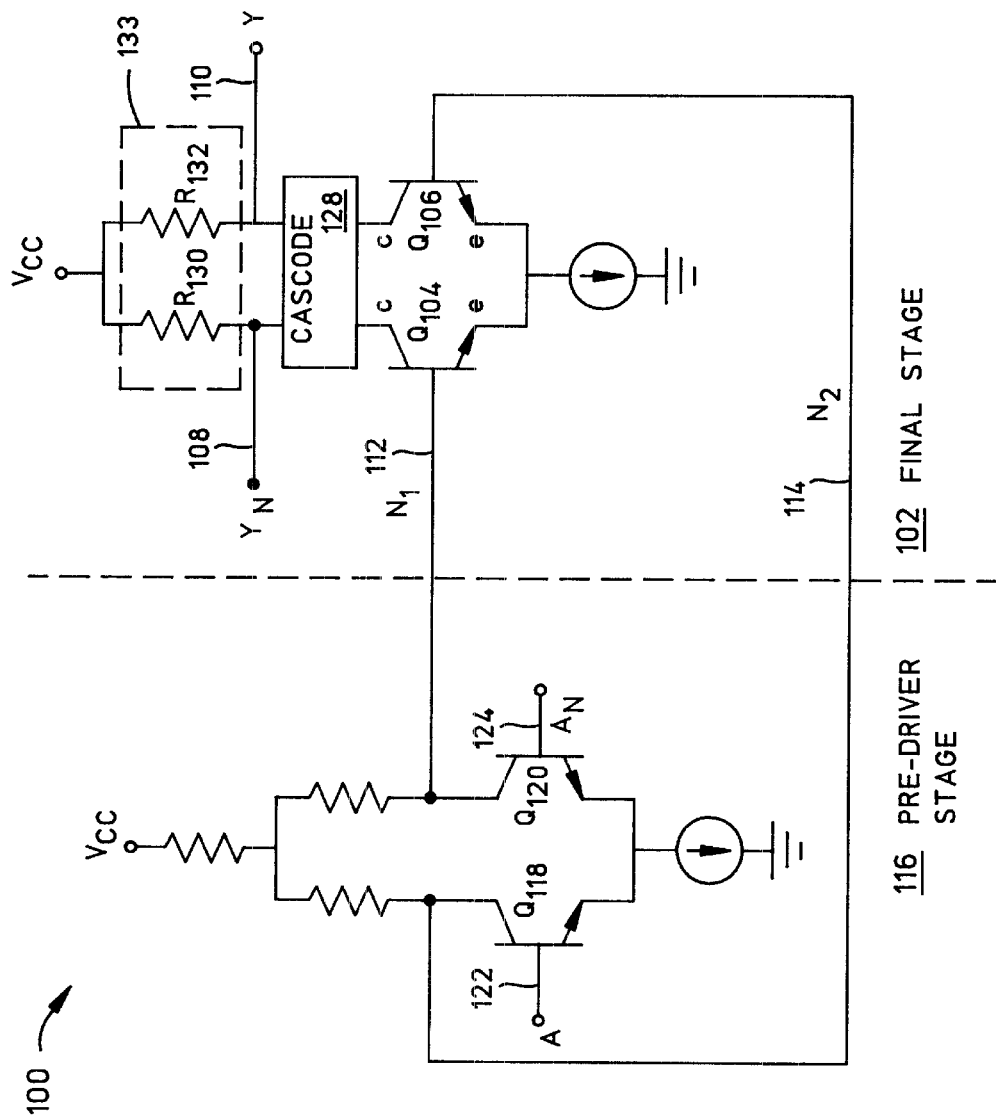
FIG. 3 is a schematic diagram illustrating the output driver circuit of the present invention.

FIG. 3 is a schematic diagram illustrating the output driver circuit of the present invention. The output driver circuit 100 comprises a final stage differential amplifier 102, including emitter-coupled first and second transistors Q104 and Q106, respectively. Final stage differential amplifier 102 includes a pair of differential outputs Yn and Y on lines 108 and 110, respectively, and a pair of differential inputs N1 and N2 on lines 112 and 114, respectively.

Output driver circuit 100 also comprises a pre-driver stage differential amplifier 116, including emitter-,coupled first and second transistors Q118 and Q120, respectively. The pre-driver differential amplifier 116 also includes a pair of differential outputs N1 and N2 connected to the differential inputs of the final stage differential amplifier 102 on lines 112 and 114. The pre-driver differential amplifier 116 has differential pre-driver input signals A and An on lines 122 and 124, respectively.

A cascode 128 is connected to the final stage differential amplifier 102 to maintain a constant voltage at the collectors (c) of the first and second transistors Q104 and A106 of the final stage differential amplifier 102.

A first load resistor R130 has a first input operatively connected to the collector (c) of the final stage differential amplifier first transistor Q104 through the cascode 128. The second input to the first load resistor R130 is connected to Vcc. A second load resistor R132 has a first input operatively connected to the collector of the final stage differential amplifier second transistor Q106 through the cascode 128. Typically, the first load resistor R130 and the second load resistor R132 are 50 ohms, but any resistance value can be used. Collectively, R130 and R132 are an example of an output impedance means 133.

Alternately stated, output driver circuit 100 comprises a final stage means 102 for differentially amplifying a pair of input signals (N1 and N2) on lines 112 and 114. A pair of output signals (Yn and Y) are generated on lines 108 and 110. A pre-driver stage means 116 for differentially amplifying a pair of pre-driver input signals (A and A1) on lines 122 and .124 provides the input signals N1 and N2 to the final stage differential amplifying means 102.

The circuit 100 also includes a means for buffering 128 the output signals on lines 108 and 110 of the final stage differential amplifying means 102 from changes to the input impedance of the final stage differential amplifying means 102 on lines 112 and 114.

The final stage differential amplifying means 102 includes the first and second emitter-coupled transistor Q104 and Q106, and the output impedance means 133 includes a first and second load resistors R130 and 132 in some aspects of the invention.

Figure 4A:
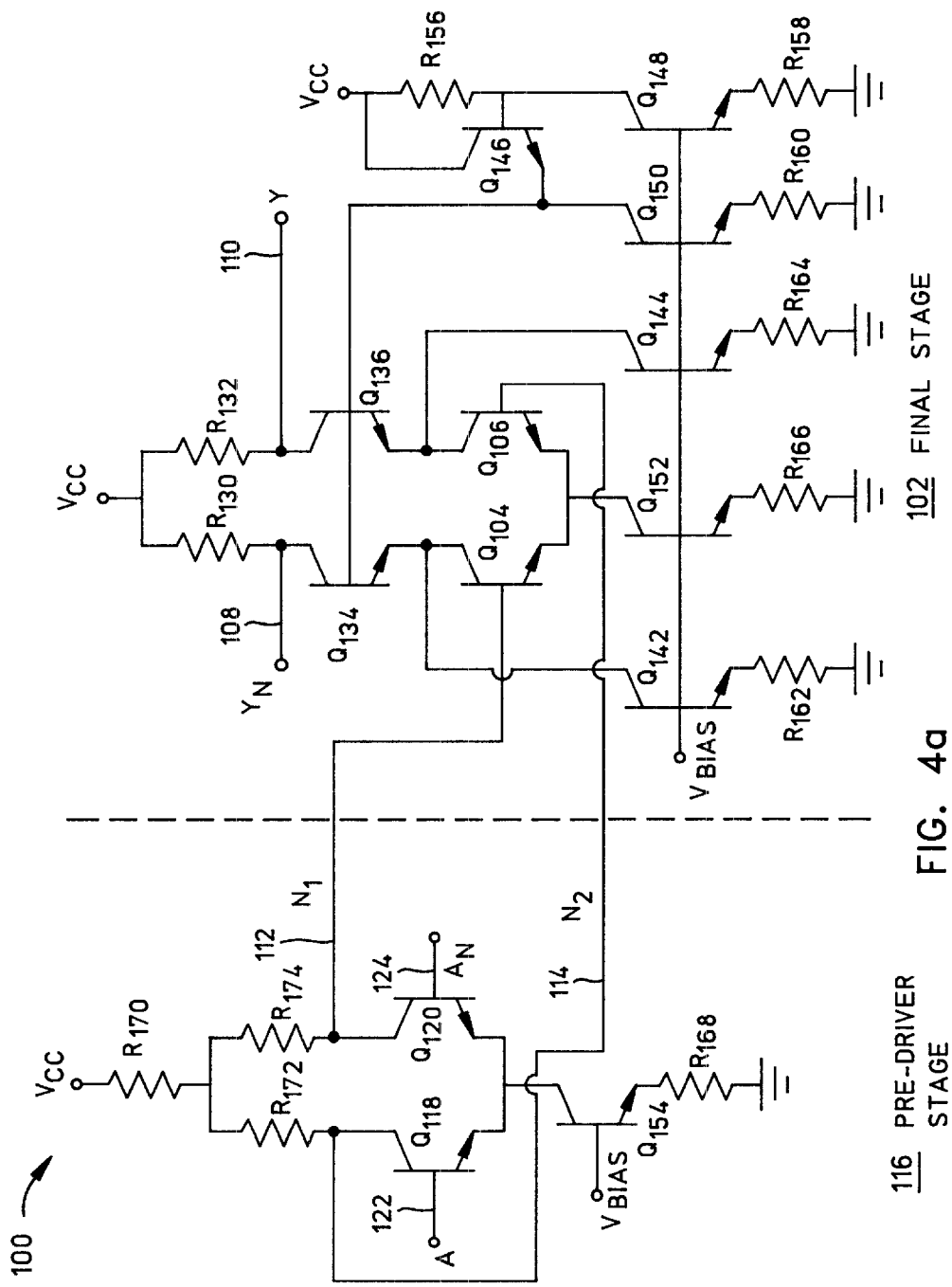
FIGS. 4a and 4b are more detailed depictions of the schematic drawing of FIG. 3.
Figure 4B:
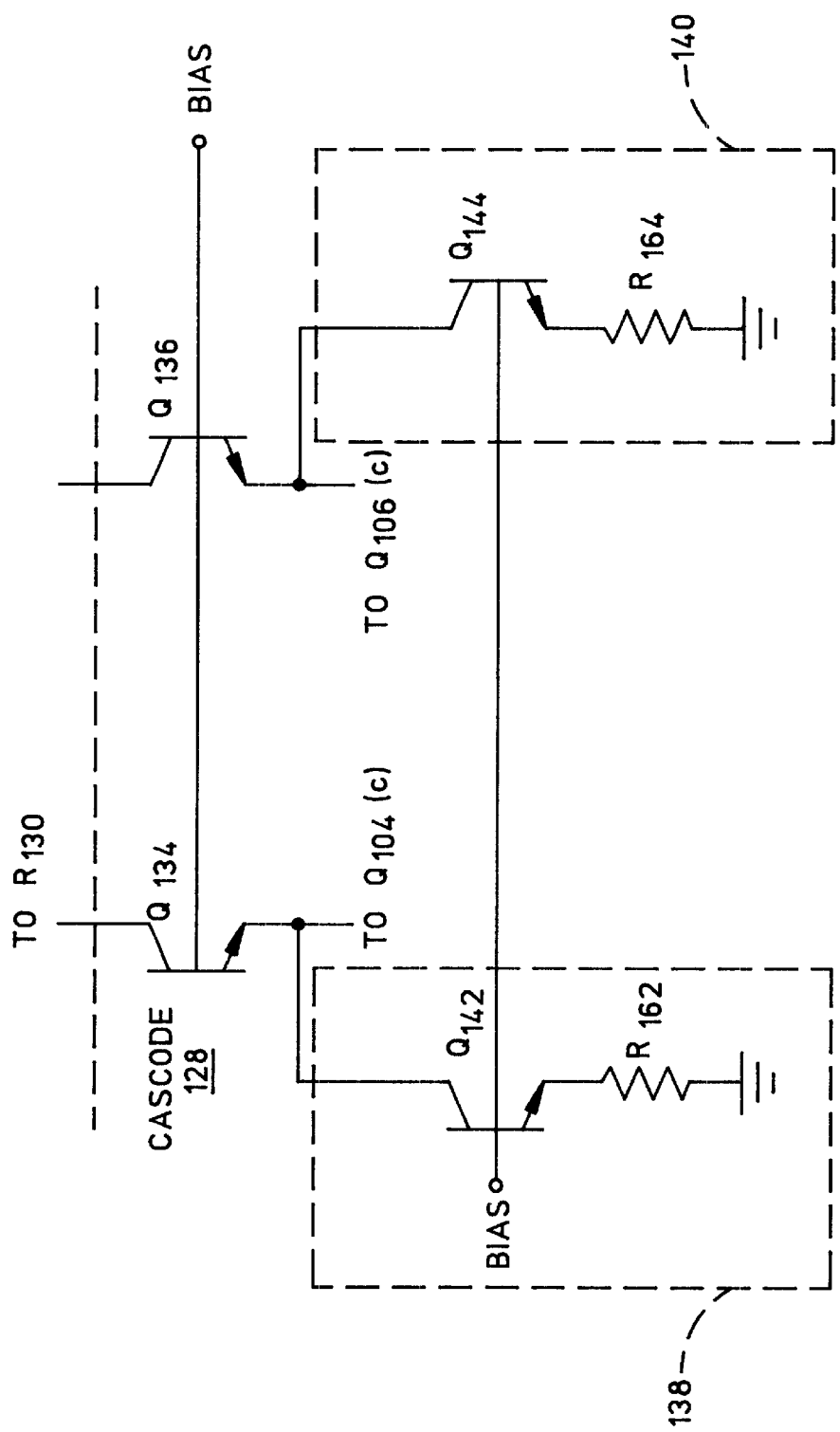

FIGS. 4a and 4b are more detailed depictions of the schematic drawing of FIG. 3. All the circuit elements are shown in FIG. 4a, while FIG. 4b specifically illustrates the cascode 128. The cascode 128 includes a pair of cascoded transistors Q134 and Q136. The first cascode transistor Q134 has a collector connected to the first load resistor R130 first input and an emitter connected to the collector of the final stage differential amplifier first transistor Q104. The second cascode transistor Q136 has a collector connected to the second load resistor R132 first input and an emitter connected to the collector of the final stage differential amplifier second transistor Q106.

The cascode 128 also includes a first current bleeder 138 (see FIG. 4b) connected to the collector of the final stage differential amplifier first transistor Q104, and a second current bleeder 140 connected to the collector of the final stage differential amplifier second transistor Q106. The current bleeders 138 and 140 continuously sink current so that when either Q104 or Q106 is not "on", their collector voltages will remain constant. The first current bleeder 138 includes a first current bleeder transistor Q142 having a collector connected to the collector of the final stage differential amplifier first transistor Q104. The second current bleeder 140 includes a second current bleeder transistor Q144 having a collector connected to the collector of the final stage differential amplifier second transistor Q106.

Returning to FIG. 4a, the collector of the pre-driver differential amplifier first transistor Q118 is connected to the base of the final stage differential amplifier second transistor Q106 (N2) on line 114. The collector of the pre-driver differential amplifier second transistor Q120 (N1) is connected to the base of the final stage differential amplifier first transistor Q104 on line 112.

The cascode 128 includes a bias circuit for the first and second cascode transistors Q134 and Q136. A first bias transistor Q146 has an emitter connected to the bases the first and second cascode transistors Q134 and Q136. A second bias transistor Q148 has a collector connected to the base of the first bias transistor Q146. A third bias transistor Q150 has a collector connected to the emitter of the first bias transistor Q146 and a base connected to the base of the second bias transistor Q148. The base of bleeder transistors Q142 and Q144 are also connected to the base of the second bias transistor Q148.

It should be noted that the bias circuits described above, and shown in FIG. 4a, are only some of many possible and widely known techniques that are available to enable the above-mentioned differential amplifier, cascode, current source, and bleeder transistors. Generally, a bias system is designed to provide consistent amplifier performance at all levels of signal amplification, across wide temperature variations, and across different part tolerance and performance variations. Other bias schemes can be used to enable the present invention, especially if specific amplifier performance features are desired.

Alternately stated, the buffering means 128 includes a pair of cascoded transistors Q134 and Q136. The buffering means 128 also includes a first means for bleeding current 138 (see FIG. 4b) connected to the collector of the final stage first transistor, and a second means for bleeding current 140 connected to the collector of the final stage second transistor 22. The first current bleeding means 138 includes a first current bleeder transistor Q142 having a collector connected to the collector of the final stage first transistor Q104 and second current bleeder transistor Q144 having a collector connected to the collector of the final stage second transistor Q106.

Returning to FIG. 4a, the pre-driver differential amplifying means 116 includes the first transistor Q118 with a collector connected to the base of the final stage second transistor Q106, and the second transistor Q120 with a collector connected to the base of the final stage first transistor Q104.

To power the output driver circuit 100 a first reference voltage having a first voltage is provided. The first reference voltage is depicted in FIG. 4a as Vcc. A second reference voltage, having a second voltage less than the first voltage is also included. The second reference voltage is depicted as ground.

A first bias resistor R156 has a first input connected to the base of the first bias transistor Q146 and a second input connected to the first reference voltage (Vcc). A second bias resistor R158 has a first input connected to the emitter of the second bias transistor Q148 and a second input connected to the second reference voltage (gnd). A third bias resistor R160 has a first input connected to the emitter of the third bias transistor Q150 and a second input connected to the second reference voltage.

A first current bleeder resistor R162 has a first input connected to the emitter of the first current bleeder transistor Q142 and a second input connected to the second reference voltage. A second current bleeder resistor R164 has a first input connected to the emitter of the second current bleeder transistor Q144 and a second input connected to the second reference voltage.

A first constant current resistor R166 has a first input connected to the emitter of the first constant current transistor Q152 and a second input connected to the second reference voltage. A second constant current resistor R168 has a first input connected to the emitter of the second constant current transistor Q154 and a second input connected to the second reference voltage.

A tap resistor R170 has a first input connected to the first reference voltage and a second input connected as described below. A first collector resistor R172 has a first input connected to the second input of the tap resistor R170, and a second input connected to the collector of the pre-driver stage differential amplifier first transistor Q118. A second collector resistor R174 has a first input connected to the second input of the tap resistor R170, and a second input connected to the collector of the pre-driver stage differential amplifier second transistor Q120.

Further, the collector of the first bias transistor Q146 is connected to the first reference voltage, and the first and second load resistors R130 and R132 have second inputs connected to the first reference voltage.

The final stage differential amplifier 102 has a first differential output (Yn) connected to the first input of the first load resistor R130 on line 108, and a second differential output (Y) connected to the first input of the second load resistor R132 on line 110.

Figure 5:
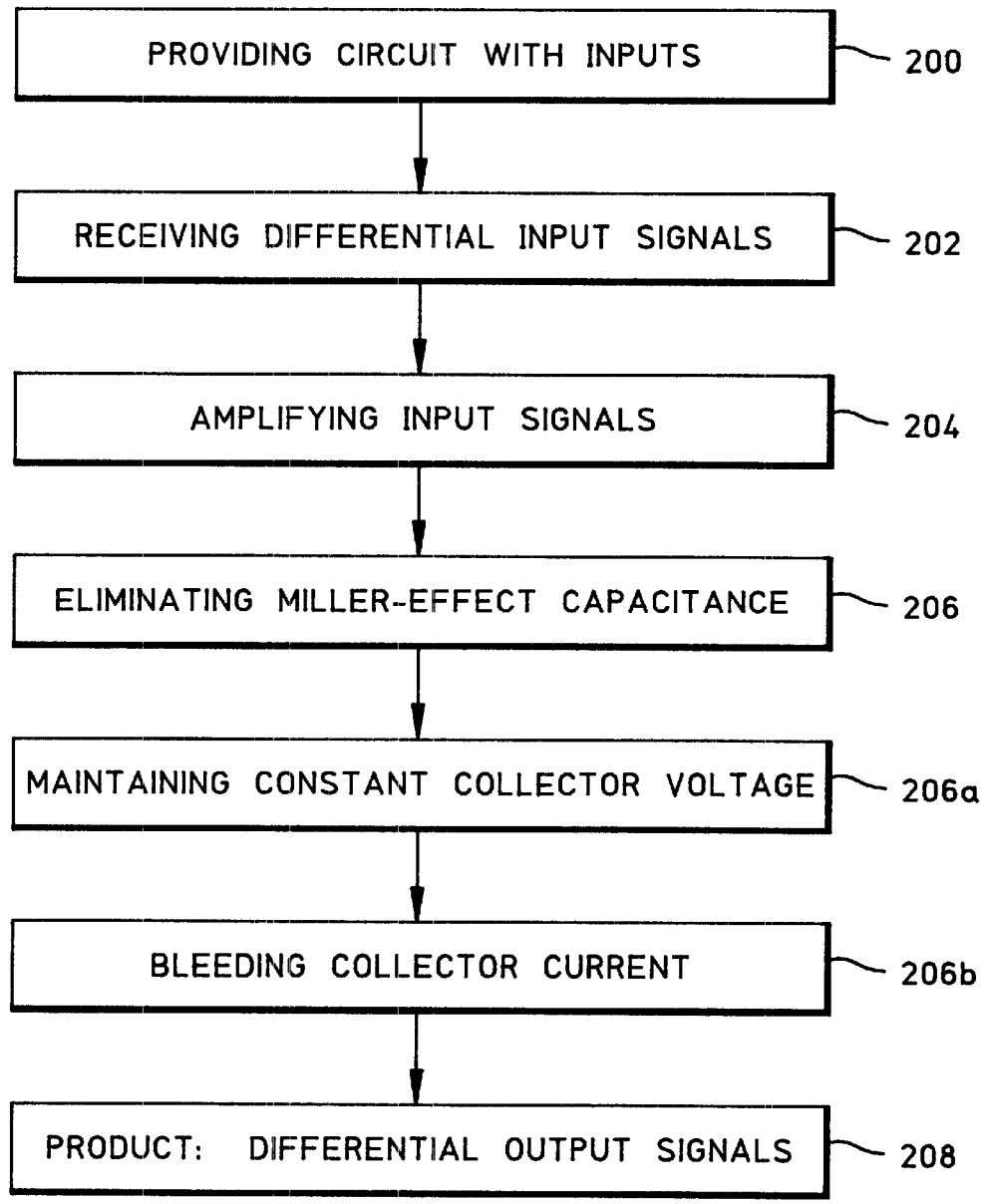
FIG. 5 is a flowchart illustrating the present invention method for amplifying differential signals.

FIG. 5 is a flowchart illustrating the present invention method for amplifying differential signals. Although the method is described as a series of numbered steps for the purpose of clarity, no order should be inferred from the numbering, unless explicitly stated. Step 200 provides a circuit having inputs. In some aspects of the invention these circuit inputs can be described as voltage inputs. Step 202 receives a pair of differential input signals at a corresponding pair of circuit inputs. In some aspects of the invention the input signals can be described as voltage input signals. Step 204 differentially amplifies the differential input signals. In some aspects of the invention Step. 204 describes a voltage gain. Simultaneously with the amplification of the differential input signals in Step 204, Step 206 eliminates any changes in the capacitance of the circuit inputs responsive to the amplification of the differential input signals. Alternately stated, Step 206 maintains a consistent gain characteristic across the range of input signal frequencies. Step 208 is a product, providing a pair of differential output signals which are amplified replicas of the corresponding differential input signals.

In some aspects of the invention Step 200 provides a final stage differential amplifier, including an emitter-coupled transistor pair. The receiving of the differential input signals in Step 202 includes receiving a varying voltage input signal at each of the bases of the final stage emitter-coupled transistors. The elimination of capacitance changes at the circuit inputs due to amplification in Step 206 includes eliminating the Miller-effect capacitance it the bases of the final stage emitter-coupled transistors as the differential input signals vary in voltage.

The elimination of capacitance changes at the circuit inputs due to amplification in Step 206 includes sub-steps. Step 206a maintains a constant voltage at the collectors of the final stage emitter-coupled transistors. In some aspects of the invention Step. 200 provides a cascode, including a pair of transistors cascoded with the final stage emitter-coupled transistors. The elimination of capacitance changes at the circuit inputs due to amplification in Step 206 includes using the cascode transistor pair to maintain a constant voltage at the collectors of the final stage emitter-coupled transistors in Step 206a.

The elimination of capacitance changes at the circuit inputs due to amplification in Step 206 includes a second sub-step. Step 206b bleeds current from the collectors of the final stage emitter-coupled transistors.

In some aspects of the invention Step 200 provides a pre-driver stage differential amplifier including a pair of emitter-coupled transistors. Then, Step 201 (not shown) provides the differential input signal from corresponding collectors of the pre-driver differential amplifier emitter-coupled transistors.

The circuit described above in FIGS. 3, 4a, and 4b, and the method described in FIG. 5, are enabled using n-p-n transistors and a first reference voltage having a higher potential than the second reference voltage. Alternately, an equivalently performing circuit could be embodied using p-n-p transistors, combinations of n-p-n and p-n-p transistors, and alternately referenced voltages. Such alternate embodiments have not been specifically described herein as one reasonably skilled in the art would be able to build these circuits from the explanations of FIGS. 3, 4a, and 4b.

Another embodiment of the present invention concept would use differential amplifiers of source-coupled field-effect transistors (FET)s, or the like. FET transistors also have the problem of Miller-effect capacitance on the gates of the transistors that results in frequency dependent amplifier gain. The invention could be embodied using FET differential amplifiers and bipolar cascode transistors, bipolar differential amplifiers and FET cascode transistors, or all FET transistors. Likewise, the transistor combinations can be varied between pre-driver and final stages. However configured, the voltage at the drain of the FET differential amplifier transistor would be maintained at a near constant level despite the input signal. These, and other embodiments and variations of the above-described invention will occur to those skilled in the art.

What is claimed is:

1. An output driver circuit comprising:
  a final stage differential amplifier including emitter-coupled first and second transistors, a pair of differential outputs, and a pair of differential inputs;
  a pre-driver stage differential amplifier including emitter-coupled first and second transistors and a pair of differential outputs connected to the differential inputs of the final stage differential amplifier;
  a cascode connected to the final stage differential amplifier to maintain a constant voltage at the collectors of the first and second transistors of the final stage differential amplifier; and
  a first and second load resistor, with the first load resistor first input operatively connected to a final stage differential amplifier first transistor collector through the cascode, and the second load resistor first input operatively connected to a final stage differential amplifier second transistor collector through the cascode;
  wherein the cascode includes a pair of cascoded transistors, with a first cascode transistor having a collector connected to the first load resistor first input and an emitter connected to the collector of the final stage differential amplifier first transistor, a second cascode transistor having a collector connected to the second load resistor first input and an emitter connected to the collector of the final stage differential amplifier second transistor, and wherein the cascode includes a first current bleeder connected to the collector of the final stage differential amplifier first transistor, and a second current bleeder connected to the collector of the final stage differential amplifier second transistor.

2. The circuit of claim 1 in which the pre-driver differential amplifier first transistor collector is connected to the base of the final stage differential amplifier second transistor, and the pre-driver differential amplifier second transistor collector is connected to the base of the final stage differential amplifier first transistor.

3. The circuit of claim 1 in which the cascode includes a bias circuit for the first and second cascode transistors comprising:
  a first bias transistor having an emitter connected to the bases of the first and second cascode transistors, a second bias transistor having a collector connected to the base of the first bias transistor, and a third bias transistor having a collector connected to the emitter of the first bias transistor and a base connected to the base of the second bias transistor.

4. The circuit of claim 3 in which the first current bleeder includes a first current bleeder transistor having a-collector connected to the collector of the final stage differential amplifier first transistor and a base connected to the base of the second bias transistor, and second current bleeder transistor having a collector connected to the collector of the final stage differential amplifier second transistor and a base connected to the base of the second bias transistor.

5. The circuit of claim 4 further comprising:
  a first constant current source transistor having a collector connected to the emitters of the final stage differential amplifier first and second transistors, and a base connected to the base of the second bias transistor; and
  a second constant current source transistor having a collector connected to the emitters of the pre-driver stage differential amplifier first and second transistors.

6. The circuit of claim 5 further comprising:
  a first reference voltage having a first voltage;
  a second reference voltage, having a second voltage less than the first voltage;
  a first bias resistor having a first input connected to the base of the first bias transistor and a second input connected to the first reference voltage;
  a second bias resistor having a first input connected to the emitter of the second bias transistor and a second input connected to the second reference voltage;
  a third bias resistor having a first input connected to the emitter of the third bias transistor and a second input connected to the second reference voltage;
  a first current bleeder resistor having a first input connected to the emitter of the first current bleeder transistor and a second input connected to the second reference voltage;
  a second current bleeder resistor having a first input connected to the emitter of the second current bleeder transistor and a second input connected to the second reference voltage;
  a first constant current resistor having a first input connected to the emitter of the first constant current source transistor and a second input connected to the second reference voltage;
  a second constant current resistor having a first input connected to the emitter of the second constant current source transistor and a second input connected to the second reference voltage;

a tap resistor having a first input connected to the first reference voltage and a second input;

a first collector resistor having a first input connected to the second input of the tap resistor, and a second input connected to the collector of the pre-driver stage differential amplifier first transistor;

a second collector resistor having a first input connected to the second input of the tap resistor, and a second input connected to the collector of the pre-driver stage differential amplifier second transistor;

in which the collector of the first bias transistor is connected to the first reference voltage; and in which the first and second load resistors have second inputs connected to the first reference voltage.

7. The circuit of claim 6 in which the final stage differential amplifier has a first differential output connected to the first input of the first load resistor; and in which the final stage differential amplifier has a second differential output connected to the first input of the first load resistor.

8. In a circuit having inputs, a method for amplifying differential signals, the method comprising:

providing a final stage differential amplifier including an emitter-coupled transistor pair;

providing a cascode including a pair of transistors cascoded with the final stage emitter-coupled transistors;

receiving a pair of differential input signals at a corresponding pair of circuit inputs of the final stage differential amplifier including receiving a varying voltage input signal at each of the bases of the final stage emitter-coupled transistors;

differentially amplifying the input signals;

simultaneously with the amplification of the differential input signals, eliminating changes in the capacitance of the circuit inputs responsive to the amplification of the differential input signals, including eliminating the Miller-effect capacitance at the bases of the final stage emitter-coupled transistors as the differential input signals vary in voltage by, with the cascode transistor pair, maintaining a constant voltage at the collectors of the final stage emitter-coupled transistors and bleeding current from the collectors of the final stage emitter-coupled transistors; and providing a pair of differential output signals which are amplified replicas of the corresponding differential input signals.

9. The method of claim 8 wherein a pre-driver stage differential amplifier including a pair of emitter-coupled transistors is provided, and further comprising:

providing the differential output signal from corresponding collectors of the pre-driver differential amplifier emitter-coupled transistors.

10. An output driver circuit comprising:

a final stage means for differentially amplifying a pair of input signals to generate a pair of output signals;

a pre-driver stage means for differentially amplifying a pair of pre-driver input signals, to provide the input signals to the final stage differential amplifying means;

a means for generating an output impedance of the final stage amplifying means; and a means for buffering the output signals of the final stage differential amplifying means from changes to the input signals from the output impedance of the final stage amplifying means;

in which the final stage differential amplifying means includes a first and second emitter-coupled transistor;

in which the output impedance means includes a first and second load resistor;

in which the buffering means includes a pair of cascoded transistors, with a first cascode transistor having a collector connected to the first load resistor and an emitter connected to the collector of the final stage differential amplifier first transistor, and a second cascode transistor having a collector connected to the second load resistor and an emitter connected to the collector of the final stage differential amplifier second transistor; and in which the buffering means includes a first means for bleeding current connected to the collector of the final stage first transistor, and a second means for bleeding current connected to toe collector of the final stage second transistor.

11. The circuit of claim 10 in which the pre-driver stage means includes a first transistor with a collector connected to the base of the final stage second transistor, and a second transistor with a collector connected to the base of the final stage first transistor.

12. The circuit of claim 10 in which the first current bleeding means includes a first current bleeder transistor having a collector connected to the collector of the final stage first transistor and second current bleeder transistor having a collector connected to the collector of the final stage second transistor.

13. An output driver circuit comprising:

a final stage differential amplifier including emitter-coupled first and second transistors, a pair of differential outputs, and a pair of differential inputs;

a pre-driver stage differential amplifier including emitter-coupled first and second transistors and a pair of differential outputs connected to the differential inputs of the final stage differential amplifier;

a cascode including a pair of cascoded transistors connected to the final stage differential amplifier; and a first and second load resistor, the first load resistor having a first input connected to a final stage differential amplifier first transistor collector through the cascode, and the second load resistor having a first input connected to a final stage differential amplifier second transistor collector through the cascode;

wherein a first cascode transistor has a collector connected to the first load resistor first input and an emitter connected to the collector of the final stage differential amplifier first transistor, a second cascode transistor has a collector connected to the second load resistor first input and an emitter connected to the collector of the final stage differential amplifier second transistor, and wherein the cascode includes a first current bleeder connected to the collector of the final stage differential amplifier first transistor, and a second current bleeder connected to the collector of the final stage differential amplifier second transistor.

14. A method for amplifying differential input signals in a circuit, the method comprising:

providing a final stage differential amplifier including an emitter-coupled transistor pair;

providing a cascode including a pair of transistors cascoded with the final stage emitter-coupled transistors;

receiving a pair of differential input signals at a corresponding pair of circuit inputs of the final stage differential amplifier;

differentially amplifying the input signals;

eliminating changes in the capacitance of the circuit inputs responsive to the amplification of the differential input signals;

bleeding current from the collectors of the final stage emitter-coupled transistors; and providing a pair of differential output signals which are amplified replicas of the corresponding differential input signals.

* * * * *